United States Patent [19]

Devlin et al.

[11] Patent Number: 5,291,328
[45] Date of Patent: Mar. 1, 1994

[54] SEMICONDUCTOR LASER AMPLIFIERS

[75] Inventors: William J. Devlin; David M. Cooper; Paul C. Spurdens; Simon Cole; Ian F. Lealman; Joseph J. Isaac, all of Ipswich, England

[73] Assignee: British Telecommunications, London, England

[21] Appl. No.: 741,418

[22] PCT Filed: Jan. 15, 1990

[86] PCT No.: PCT/GB90/00055
§ 371 Date: Aug. 1, 1991
§ 102(e) Date: Aug. 1, 1991

[87] PCT Pub. No.: WO90/08411
PCT Pub. Date: Jul. 26, 1990

[30] Foreign Application Priority Data

Jan. 13, 1989 [GB] United Kingdom ............... 8900729

[51] Int. Cl.$^5$ .............................................. H01S 3/19
[52] U.S. Cl. ...................................... 359/344; 372/45
[58] Field of Search ......................... 359/344; 372/45; 357/17, 30

[56] References Cited

U.S. PATENT DOCUMENTS

| 4,742,307 | 5/1988 | Thylèn | 359/344 |
| 4,794,346 | 12/1988 | Miller | 372/45 |
| 4,964,134 | 10/1990 | Westbrook et al. | 372/45 |
| 5,015,964 | 5/1991 | O'Mahony | 359/344 |

FOREIGN PATENT DOCUMENTS

| 3631971 | 3/1987 | Fed. Rep. of Germany . |
| 1539028 | 1/1979 | United Kingdom . |

OTHER PUBLICATIONS

*Electronics Letters*, vol. 24, 1988, pp. 551–552, Grosskopf et al: "Cascaded Inline Semiconductor Laser Amplifiers in a Coherent Optical Fibre Transmission System".
*Elecronics Letters*, 26th Feb. 1987, vol. 23, No. 5, Saitoh et al: "Broadband 1-5 μm GaInAsP Travelling-Wave Laser Amplifier With High-Saturation Output Power".
*Proc. ECOC*, Brighton, 1988, pp. 487–490, Malyon et al: "A Novel All Electrical Scheme For Laser Amplifier Gain Control".
*Electronics Letters*, vol. 24, 1988, pp. 1075–1076, Olsson: "Polarisation-Independent Configuration Optical Amplifier".
*Electronics Letters*, vol. 23, 1987, pp. 1387–1388, Groffkopf et al: "Optical Amplifier Configurations with Low Polarisation Sensitivity".
*Transactions of the IEICE*, vol. E71, No. 5, May 1988, pp. 482–484, Saitoh et al: "Structural Design of Polarization Insensitive 1.55-μm Travelling-Wave Semiconductor Laser Amplifiers".
*I.E.E.E. Journal of Quantum Electronics*, QE-23 (1987) Jun., No. 6, New York, N.Y., pp. 1021–1026, Oberg et al: "InGaAsP-InP Laser Amplifier with Integrated Passive Waveguides".
*Electronics Letters*, 26th Sep. 1985, vol. 21, No. 20, Nelson et al: "High Power Low Threshold BH Lasers Operating at 1-82 μm Grown Entirely by Movpe", pp. 888–889.
ThKw OFC '88, New Orleans, La. USA, 1988, Cooper et al: "THK2 Properties of Defumed buried heterostructure distributed feedback lasers grown by metal-organic vapor phase epitaxy".
*Electronics & Communications in Japan*, vol. 70, No. 2, part II; Electronics Feb. 1987; Scripta Technica Inc. (New York), Mukai et al: "1.5 μm InGaAsp Fabry-Perot Cavity-Type Laser Amplifiers".

*Primary Examiner*—Ian J. Lobo
*Attorney, Agent, or Firm*—Nixon & Vanderhye

[57] ABSTRACT

A semiconductor laser amplifier includes both a waveguide layer and an active layer. In use, an optical wave in the active layer interacts with the waveguiding layer to reduce the polarisation sensitivity of the amplifier. A short, thick active layer is not required, typical dimensions being 250 or 500 μm long, by 0.2 μm high. The mesa is typically about 2 μm wide, but may be wider.

21 Claims, 6 Drawing Sheets

SEMICONDUCTOR LASER AMPLIFIERS

The present invention relates to semiconductor laser amplifiers.

Semiconductor laser optical amplifiers have many possible applications in future optical systems, particularly in optical communications systems and optical data processing. Such amplifiers provide high gain with low power consumption, and their single mode waveguide structure makes them particularly suitable for use with monomode optical fibre.

The radiation used in optical communications is not necessarily in the visible region, and the words "optical" and "light" when used in this specification are not to be interpreted as implying any such limitation. Indeed, if silica optical fibres are used as the transmission medium, infra red radiation is of especial usefulness because loss minima occur in such fibres at 1.3 and 1.55 μm approximately.

In optical transmission systems using single longitudinal mode lasers the effects of fibre dispersion may be small, the main limitation on repeater spacing being the signal attenuation due to fibre loss. Such systems do not require a complete regeneration of the signal at each repeater, amplification of the signal is sufficient. Thus semiconductor laser amplifiers can be used as linear optical repeaters for intensity modulated or coherent systems. Linear amplifier repeaters, and in particular travelling wave repeaters, have the additional advantages of being bit rate independent, bidirectional, and capable of supporting multiplex operation.

A semiconductor laser amplifier can be used in an optical receiver to amplify the optical signal before it reaches the photodetector, thereby increasing detection sensitivity. The improvement can be particularly marked for bit rates in excess of 1 Gbit/s, making such amplifiers potentially useful in the development of sensitive wideband receivers for use in future fibre systems.

The performance of laser amplifiers in systems is dependent upon several factors, including the amplifier gain and saturation characteristic, the amplifier optical bandwidth, the stability of gain with respect to bias current and temperature, the amplifier noise characteristics, and sensitivity to input signal polarisation. Clearly, for any practical application it is desirable for gain to be frequency independent, at least within the frequency range of the optical input. This is of course of particular significance where the laser amplifier is to be used in systems involving wavelength division multiplexing (wdm) or in systems where optical carriers of several different wavelengths are used, particularly where several such carriers are used simultaneously. A second desirable characteristic for a practical system is that the gain of the laser amplifier should be independent of the input signal polarisation. This last characteristic is of particular significance in optical fibre systems, since random polarisation fluctuations are currently unavoidable in practical systems. Much research has been carried out in an effort to find laser structures with high gain over a usefully wide optical bandwidth, with suitably low polarisation sensitivity. Thus although usefully high gains, typically between 24 and 29 dB, have been achieved, polarisation sensitivity remains a problem. In particular, although polarisation sensitivities as low as 2 to 3 dB have been achieved, typical sensitivities are between 3 and 6 dB, and the results have been strongly frequency dependent, polarisation sensitivities of 7 dB or more being typical at non-favoured frequencies, thus laser amplifiers cannot satisfactorily be used in wdm systems.

In recent travelling wave semiconductor laser amplifier (TWSLA) systems demonstrations (see for example: Proc. ECOC, Brighton, 1988, pp 163–166, D. J. Malyon et al, and Electron Lett., Vol. 24, 1988, pp 551–552, G. Grosskopf et al) the polarisation of the input signal had to be carefully controlled due to a polarisation-dependent gain. The problem of polarisation-dependent gain appears to be exacerbated in device designs which give high saturated output power. Indeed the TWSLA with the highest reported output at 3 dB gain compression (+9 dBm) had a polarisation sensitivity of 7 dB, Electron. Lett., Vol. 23, 1987, pp 218–219, T. Saitoh and T. Mukai. Gain variations have been compensated for by either electronic means (Proc. ECOC, Brighton, 1988, pp 487–490, A. D. Ellis et al), or by using orthogonally aligned two-amplifier configurations (Electron. Lett., Vol. 24, 1988, pp 1075–1076, N. A. Olsson; Electron. Lett., Vol. 23, 1987, pp 1387–1388, G. Grosskopf et al). Although these schemes have been successfully demonstrated, extra components are required for their implementation.

Clearly, it would be desirable to have a TWSLA with low polarisation sensitivity, but not at the expense of the high saturated power needed for wide dynamic range and good signal-to-noise performance (see for example IEEE Trans, MTT-30, 1982, pp 1548–1556, T. Mukai et al).

In a recent theoretical paper, (Transactions of the IEICE, Vol. E71, No. 5, May 1988, pp 482–484), Saitoh and Mukai reported that the optimum configuration for achieving polarisation insensitive gain in a travelling wave semiconductor laser amplifier while maintaining high output power and low noise performance is one with a thick, short active layer. Saitoh and Mukai predict that an undoped 1.5 μm GaInAsP travelling wave amplifier having an active layer thickness of 0.5 μm and an active layer length of 45 μm could have a 20 dB signal gain, with an operating current of 100 mA, and a polarisation sensitivity of only 0.6 dB. They also predict that under these conditions, such a device would have a saturated output power, $P_{3\,dB}$, of 9.6 dBm, and a noise figure (the degradation in S/N ratio which results from amplification) of 4 dB.

One of the disadvantages of structures of the type proposed by Saitoh and Mukai is that with such a thick active layer there is a strong likelihood that modes other than the zero order mode will be supported in the vertical direction. Additionally, the high current densities which result from the use of short devices are likely to lead to problems with reliability and thermal dissipation.

It has previously been proposed to use laser amplifiers having a waveguiding layer separate from the active layer, but generally this has been in the context of optical integrated circuits (OIC). In such circuits a waveguiding arrangement is used to 'pipe' the optical signals to be processed about the circuit; the active layer of a laser amplifier is spaced from the waveguid and operates in association therewith in a directional coupler mode. One such arrangement is described in outline in British Patent 1539028. The waveguiding layer in such arrangements appears to be provided solely to act as a conduit to route optical signals between the OIC input and output and different processing points in the OIC, the optical signals having been provided initially either by a laser source which is part of the OIC or having been received by the OIC from some remote source. As far as we are aware, no-one has observed or suggested that the effective addition of a waveguiding layer to a laser amplifier structure results or is likely to result in a reduction in polarisation sensitivity.

In another reference related to OICs, IEE Journal of Quantum Electronics, QE-23, 1987, No. 6, pp 1021-1026, Oberg, Bröberg and Lindgren, a laser amplifier is integrated within a passive waveguiding structure. The object of the reported work was to establish and, if possible, demonstrate the possibility of fabricating such a composite structure in which the junction between active and passive parts gives a high coupling efficiency and a reflectivity low enough to allow travelling-wave type operation of the laser amplifier. Again the passive waveguide structure serves as a conduit for the distribution of optical signals to be processed. It is suggested in the paper that such OICs could be used in switching systems for local area networks in place of discrete amplifiers, the OICs providing the amplification and other functions necessary, thereby eliminating connection difficulties, coupling losses and unwanted reflections. Of course, travelling-wave operation is desirable for laser amplifiers in such applications because of the need to minimise wavelength-sensitivity.

The structure used by Oberg et al is unusual in that the passive waveguide and the amplifier's active layer are formed on a common planar n-InP buffer layer. Over the InGaAsP active layer ($\lambda_g = 1.3$ μm) there is formed a p-InP 'depression' layer. The passive waveguide of p-InGaAsP ($\lambda_g = 1.08$ μm) has a thickness of 0.55 and 0.3 μm close to and far away from the junction respectively. The passive waveguide material continues over the depression layer which overlies the active layer, the overall thickness of the waveguide-depression layer-active layer stack apparently being the same as the immediately adjacent regions of passive waveguide material, that is about 0.55 μm. The active and depression layers are either 0.22 and 0.18 μm respectively or both 0.15 μm. It appears therefore that in the active region the waveguide-depression layer-active layer stack functions as a composite waveguide and not in a directional-coupler mode. There is no suggestion, however, that such a structure should be fabricated for use as a discrete device—the waveguide is clearly only present for use as a signal conduit in an OIC. Oberg et al are also, unsurprisingly, silent as to the polarisation sensitivity of an amplifier with such a structure.

We are, however, aware of one discrete laser amplifier which comprises an active layer and a separate waveguiding layer, described in U.S. Pat. No. 4,742,307 in the name of Thylen, assigned to L. M. Ericsson. The device is intended to overcome the problems of back reflection and backward-launched noise which occur with conventional laser amplifiers. In order to overcome these problems the device operates on the principle of a directional coupler. Light to be amplified is input to a passive waveguide which continues as far as the output facet where it is aligned with an output fibre. Spaced from the passive waveguide in a directional coupler relationship is the device's active layer. The ends of the device's active layer are left unpumped or are etched to provide a rough surface, the object being to reduce the amount of rearward travelling signal coupled back into the passive waveguide. Because the device has to operate in a directional coupler mode, the separation between the active and waveguiding layers has to be quite large, e.g. 1 μm. Nowhere is there any suggestion that the device has a low polarisation sensitivity or is in any way suitable to receive variable polarisation state input signals.

The present invention seeks to provide a semiconductor laser amplifier which has high gain and low polarisation sensitivity over a usefully broad frequency range.

According to a first aspect the present invention provides a semiconductor laser amplifier comprising an active layer and a separate waveguiding layer.

We have discovered the surprising fact that by using a structure which is analogous to a buried-heterostructure distributed feedback laser having a waveguiding layer and an active layer in close association, but without the grating, it is possible to achieve high gain and low polarisation sensitivity over a usefully broad wavelength range.

Embodiments of the invention will now be described by way of example only, with reference to the accompanying drawings, in which.

Figure 2:
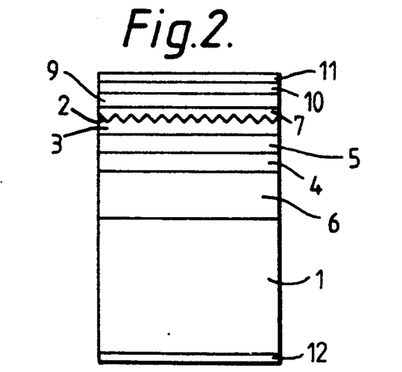
FIG. 2 is a similar schematic vertical section through a distributed-feedback laser similar in structure to the amplifier of FIG. 1.

Referring now to FIG. 2, a known type of distributed feedback laser comprises a buried heterostructure mesa in which the grating 2 which provides the feedback necessary for laser operation is grown in one surface of a semiconductor layer 3 other than the laser's active layer 4, the former layer functioning as a waveguiding layer, there additionally being provided a spacer layer 5 separating the waveguiding layer and the active layer. The spacer layer 5 is provided for several reasons:

(i) Typically the waveguiding layer 3 and the active layer 4 are required to have different refractive indices, but may both be quaternary semiconductors based on the same elements, although of course having different compositions. During growth of the heterostructure, abrupt changes of gas flow would be expected if layer 3 was grown immediately after layer 4 or vice versa. By growing a spacer layer having a completely different composition, i.e. a binary rather than quaternary semiconductor, to the first grown of layers 3 and 4, it is readily possible to keep the gas flow rate fairly constant and yet still produce the desired properties in layers 3 and 4. As those skilled in the art of heterostructure fabrication will appreciate, while the spacer layer, which in the present example comprises InP, is grown using for instance gas stream A, gas stream B, which would just have been used to grow the InGaAsP active layer, would be stabilised for the InGaAsP waveguide layer composition and be running to waste. With the spacer layer complete, gas stream A would be sent to waste and gas stream B would enter the reactor.

(ii) The spacer layer also facilitates etching the mesa structure using compositionally selective wet chemical etches.

(iii) Of more direct relevance in the context of distributed feedback lasers, it is possible to control the optical coupling to the grating in the waveguiding layer by adjusting the thickness of the spacer layer. The spacer layer should also suppress carrier overflow.

Figure 1:
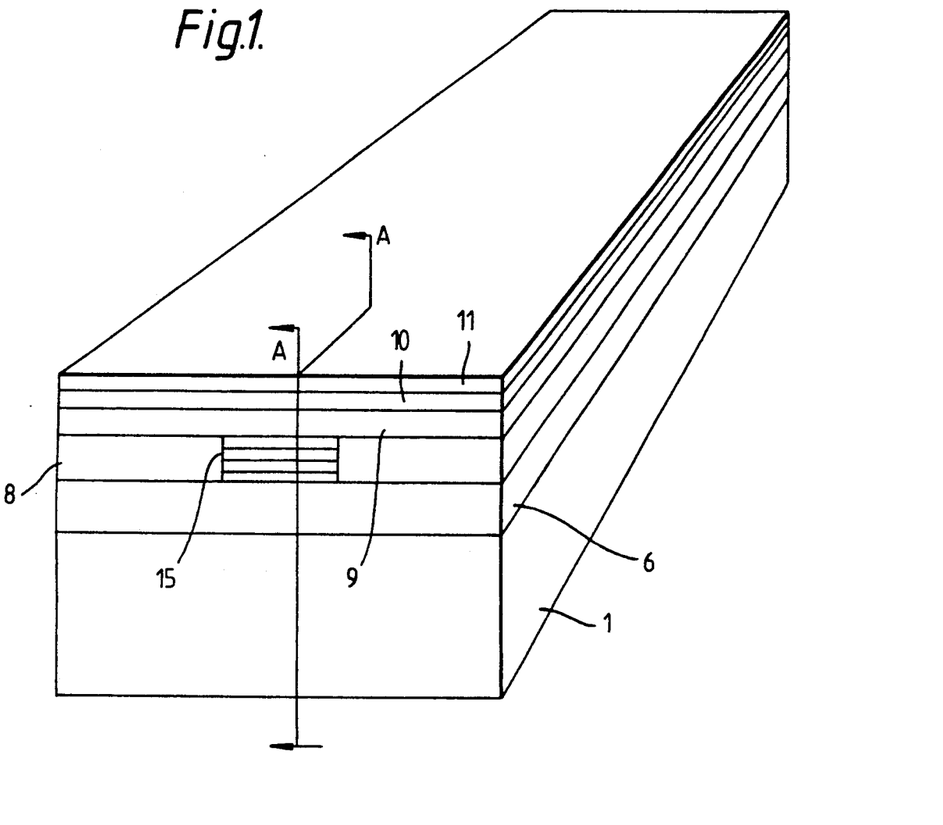
FIG. 1 is a schematic perspective view of an embodiment of a laser amplifier according to the present invention.

The laser amplifier of FIG. 1 was fabricated using three stages of MOVPE growth, further details of which can be found in the following two publications, each of which is herein incorporated by this reference: Nelson, A. W., Devlin, W. J., Hobbs, R. E., Lenton, C. G. D. and Wong, S., "High power, low threshold BH lasers operating at 1.52 $\mu$m grown entirely by low pressure MOVPE", Elec. Lett., 1985, Vol. 21, pp888–889; and Cooper, D. M., Evans, J. S., Lealman, I. F., Regnault, J. C., Spurdens, P. C. and Westbrook, L. D., "Properties of detuned BH distributed feedback lasers grown by MOVPE", paper Thk2 OFC 88, New Orleans, La., USA.

Figure 1A:
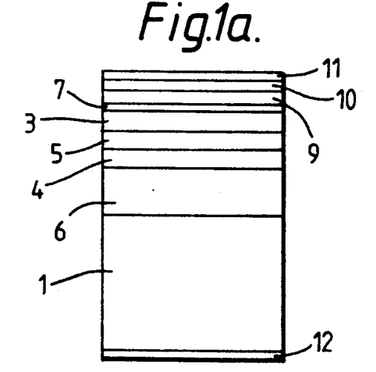
FIG. 1a is a schematic vertical section, along the line A—A, through the device of FIG. 1.

All three stages were carried out in a horizontal reactor operating at atmospheric pressure using the metal alkyls trimethyl indium (TMIn) and trimethyl gallium triethyl phosphorus (TMGa.TEP) as the group III sources and arsine and phosphine as the group V element precursors. Dimethyl zinc and hydrogen sulphide provided the n and p dopants respectively and all growth stages were performed at 650° C. The first stage involved growing on an InP wafer 1 a planar structure consisting of an n-type InP buffer layer 6 2 $\mu$m thick followed by a 0.18 $\mu$m thick InGaAsP ($\lambda=1.53$ $\mu$m) active layer 4, a 0.16 $\mu$m p-type InP spacer layer 5, a 0.23 $\mu$m InGaAsP ($\lambda=1.13$ $\mu$m) waveguide layer 3 and finally a thin (0.05 $\mu$m) p-type InP cap layer 7.

A mesa was then formed using an SiO$_2$ mask, conventional photolithography and selective etches of HBr and 3(IN):1:1 (K$_2$Cr$_2$O$_7$:H$_2$SO$_4$:Hcl). The width of the waveguide layer was 2.0 $\mu$m and the active layer width after notching was 1.4 $\mu$m.

Current blocking layers 8 of p and n InP were selectively grown around the mesa. After the removal of the oxide, the whole device was covered in a p-type InP layer 9 and a p+ contacting layer 10 of InGaAs. Contacts were made using sputtered Ti/Pt/Au 11 on the p-side and Ti/Au 12 on the n-side.

Typical device thresholds for 250 $\mu$m and 500 $\mu$m devices prior to cleaving were about 12mA and 19mA respectively. Individual laser amplifiers were formed by cleaving the wafer into bars, 500 $\mu$m wide which were then facet coated with a single layer coating of HfO$_2$ (the devices had a residual facet reflectivity of about 0.25%) or with broadband, three layer coatings of (i) alumina, silicon and magnesium fluoride or (ii) alumina, silicon and silica (giving residual facet reflectivities in the range 0.01 to 0.1%). The threshold current of the device after AR coating was typically 100 mA. Finally, the laser amplifiers were mounted on diamond heat sinks p-side down using an Au/Sn solder.

Figure 5:
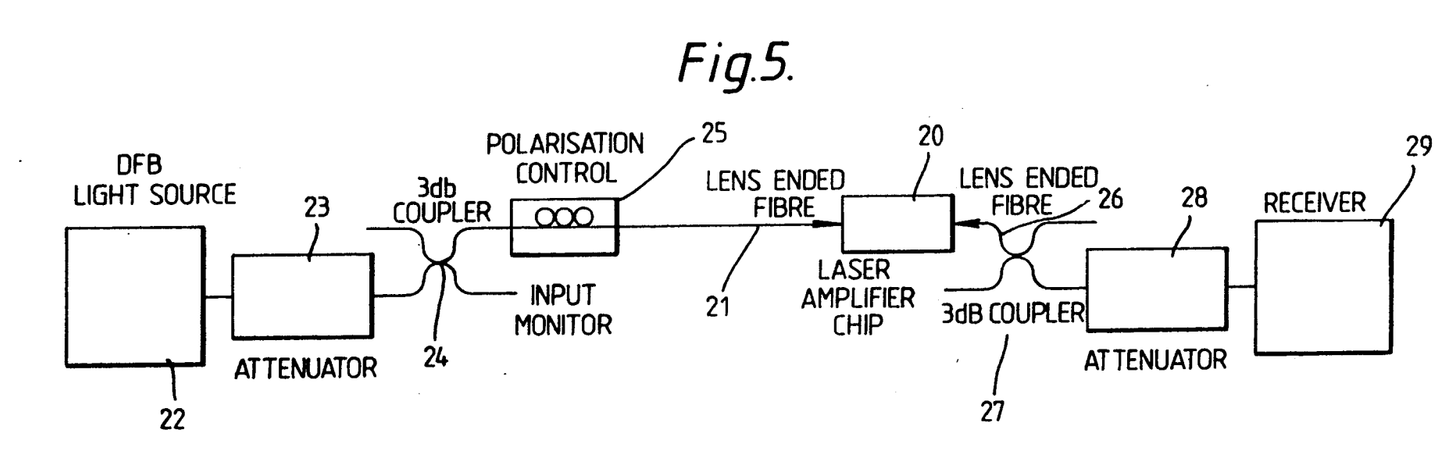
FIG. 5 is a schematic diagram of the experimental arrangement used in producing the results reproduced in FIGS. 3 and 4.
Figure 6A:
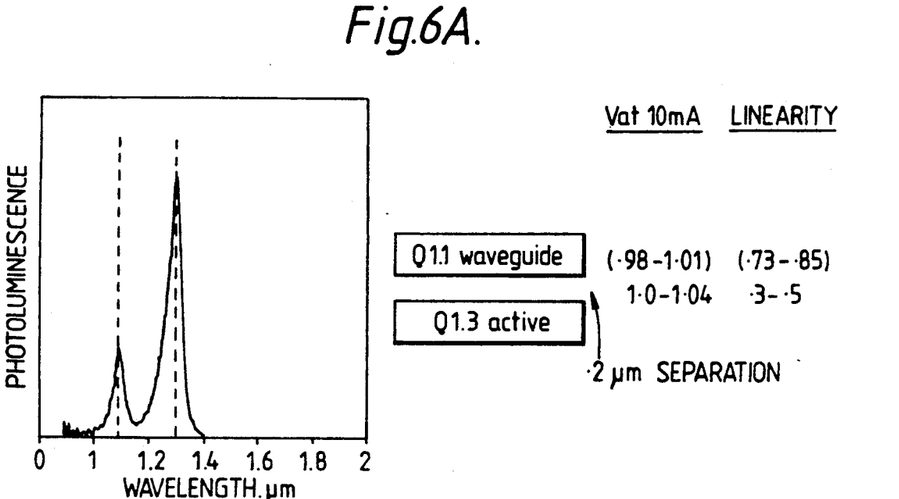
FIGS. 6A–6D shows a series of photoluminescence plots for a series of devices in which the separation between the waveguiding layer and the active layer was varied.
Figure 6B:
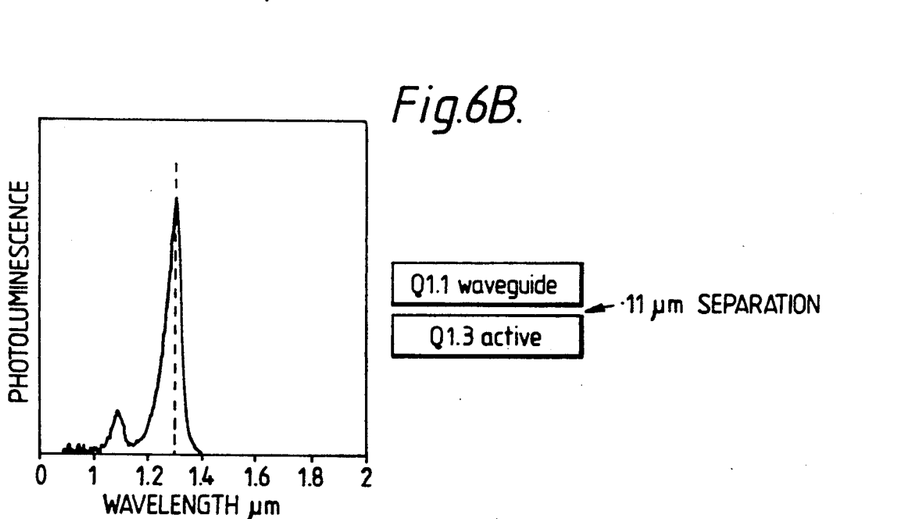
Figure 6C:
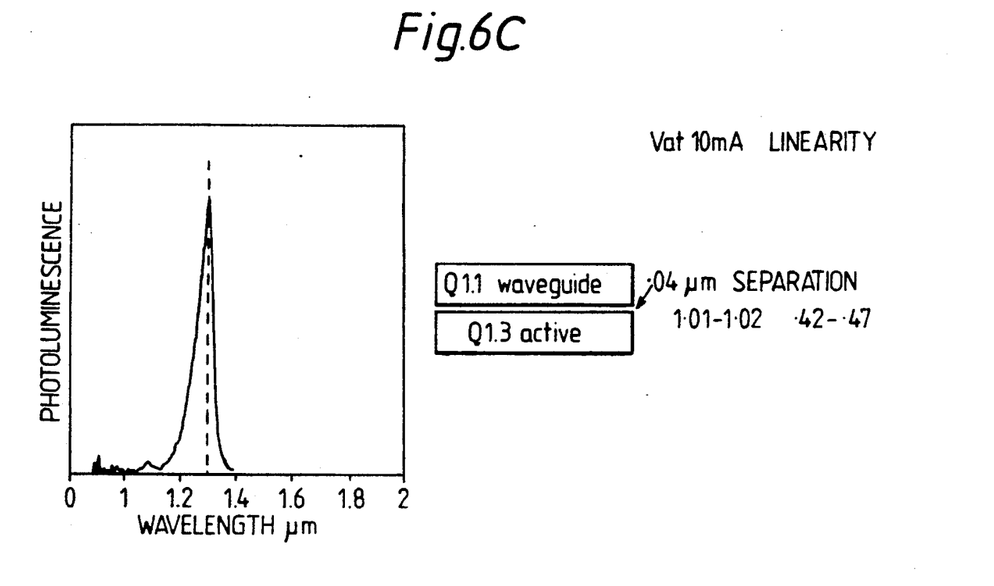
Figure 6D:
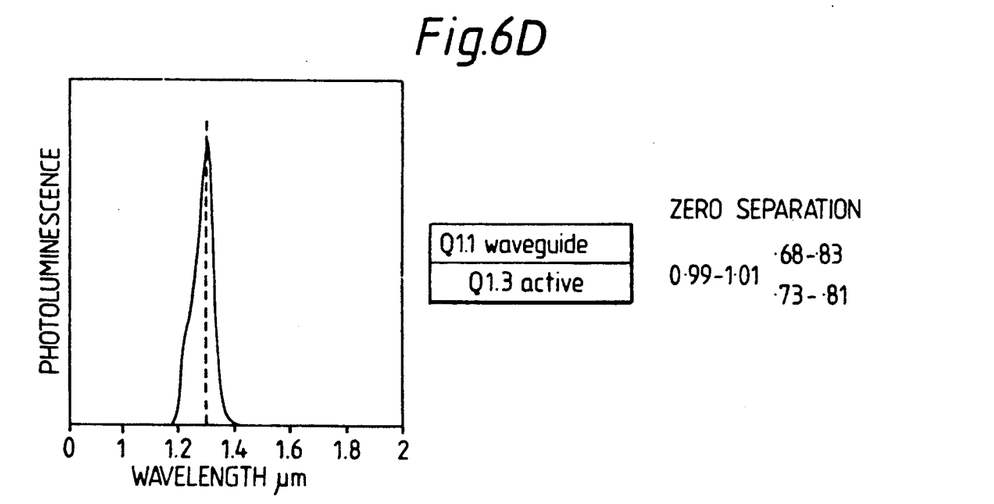

FIG. 5 shows the experimental arrangement used to assess the performance of TWSLA according to the invention. The laser amplifier 20 which is under test receives, via an AR coated lens ended fibre 21, light from a light source 22. Between the light source 22 and the laser amplifier 20 there is an attenuator 23, a 3 dB coupler 24 and polarisation control means 25. The coupler 24 enables the input optical power to be monitored. The facet input power to the amplifier was −28 dBm. The output of the laser amplifier 20 is coupled into a further lens ended fibre 26, and thence via a further 3 dB coupler 27 and attenuator 28 into an optical receiver 29.

Buried heterostructure (BH) DFB lasers, also fabricated by the all MOVPE process (the above referenced paper ThK2 by Copper, D. M. et al), were used as the optical source 22. These DFB lasers were temperature tunable, each with a tuning range of 3 nm. Lasers with wavelength ranges centered at 1503, 1509 and 1516 nm were used in the experiments.

Figure 3:
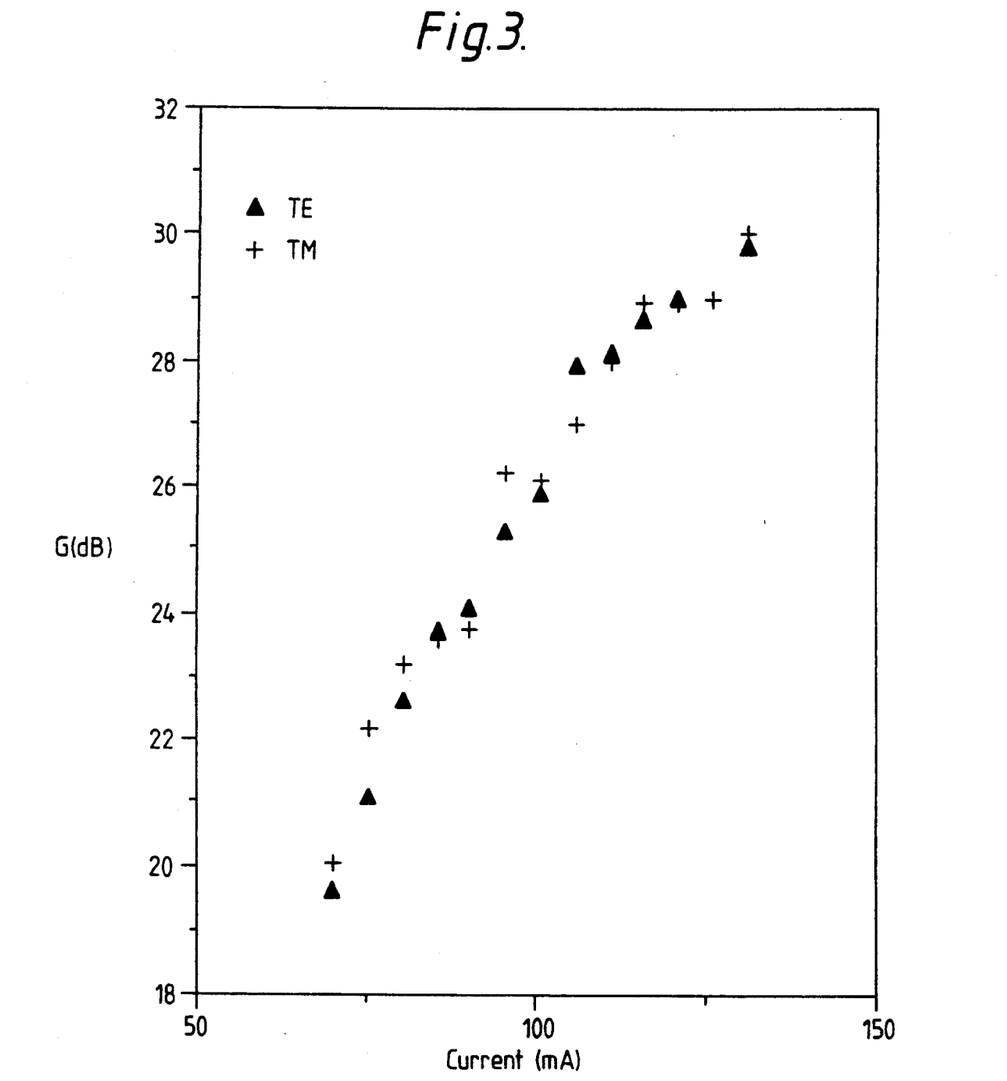
FIG. 3 is a graph illustrating the gain of an optical amplifier according to the invention for orthogonal input polarisation states.

FIG. 3 shows the internal TE and TM gain of an example of a TWSLA according to the invention as a function of bias current. The effects of residual Fabry-Perot resonances have been allowed for by returning for the different polarisations. Typically, at a bias current of 95 mA there is a 3 dB passband ripple.

As can be seen from the figure, the TWSLA described here shows a very low polarisation sensitivity. In fact the polarisation sensitivity of the device was less than the 1 dB measurement uncertainty (measurement uncertainty was estimated by repeated measurements under the same conditions and was found to be similar to the scatter in the overall data), with an associated gain of 30 dB. The measurements of FIG. 3 are for a 1509 nm source wavelength. Similar results have been obtained with the same device at 1503 and 1516 nm.

Figure 4:
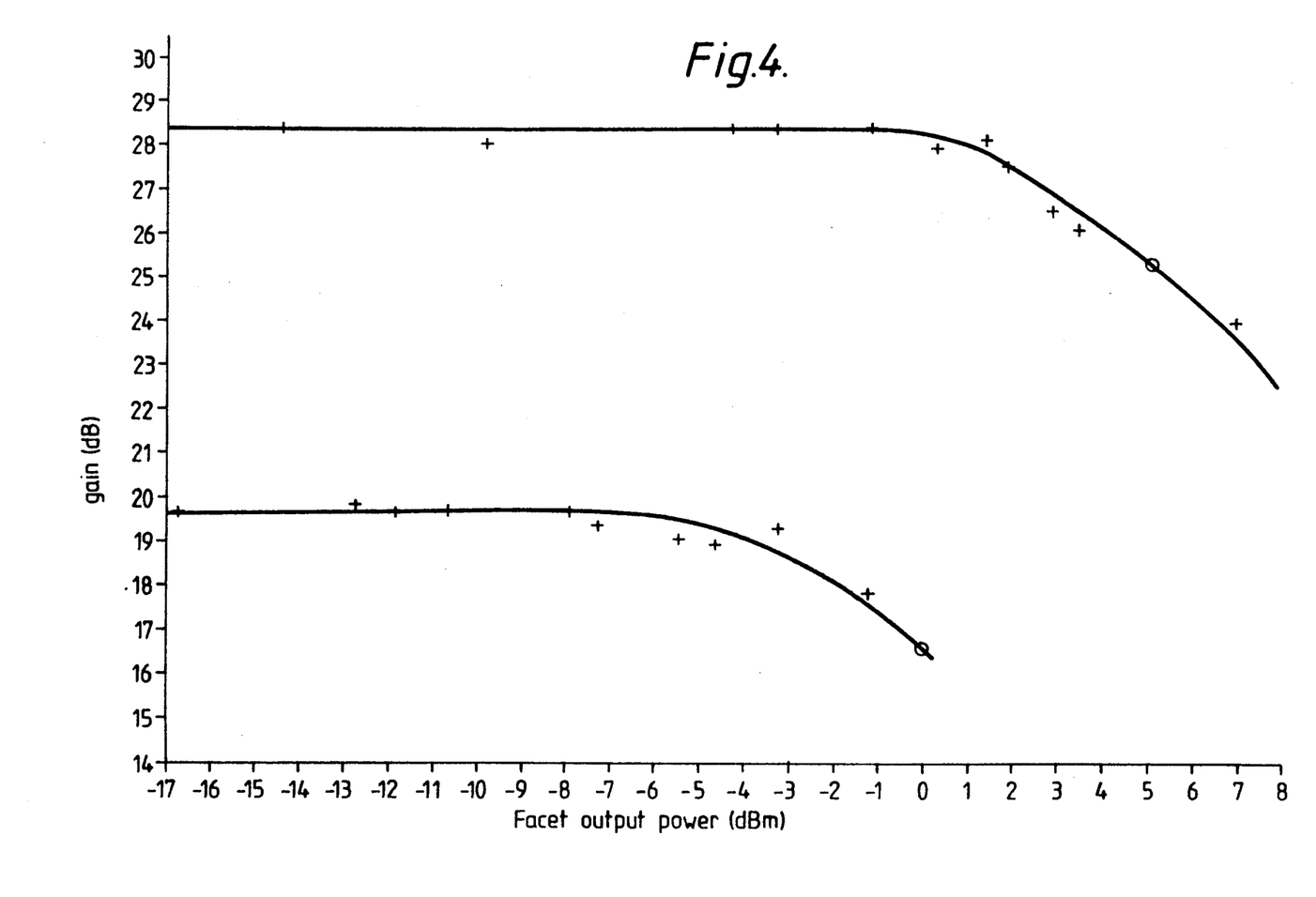
FIG. 4 is a graph illustrating the gain saturation characteristic of a laser amplifier according to the invention measured at 1516 nm.

FIG. 4 shows the results of measurement of the gain of the device as a function of input power, with the device biassed for unsaturated gains of 20 and 28 dB: the saturated output powers being 0 and 5.2 dB, respectively, at the 3 dB compression point.

In devices according to the invention the polarisation dependence of the optical confinement factor has largely been eliminated.

As mentioned earlier, the laser amplifier shown in FIG. 1 was developed from a distributed feedback laser. Since the laser amplifier is made without a grating, the chief reasons for forming the waveguide layer after the active layer (which are to avoid 'meltback' of the grating and to avoid the necessity of having to grow the device's sensitive active layer over the grating) no longer apply. Consequently it is feasible to grow the waveguiding layer before the active layer. If this is done, the spacer layer is no longer needed to facilitate etching the mesa structure using compositionally selective wet chemical etches, although it should be pointed out that as the Q1.5 active layer etches more rapidly than the Q1.1 waveguide layer in the present mesa definition process, putting the waveguide layer below the active layer would be likely to lead to problems in etching the complete mesa as described above. An alternative structure which avoids this and other problems of simple inversion is described below. Similarly, the spacer layer is no longer needed as a means of controlling the optical coupling to the grating. Hence the spacer layer in such an 'inverted' structure would serve only one of its original purposes, namely that of facilitating maintenance of stable gas flow during the various growth stages. We have found that stable gas flow can be maintained without having to grow a spacer layer, in which case the spacer layer can be dispensed with. Of course in such inverted structures the waveguide would be n-type rather than p-type and since carrier mobility and recombination would be different this can lead to different optical performance.

The 'alternative' structure referred to above is based on the following plan. On an n-type InP substrate, is grown an n-InP buffer layer of, typically, 2 μm thickness, a 0.2 μm GaInAsP (λ=1.1 μm) waveguide, a 0.2 μm n-InP spacer, a 0.2 μm undoped GaInAsP (λ=1.5 μm) active layer and a 0.3 μm p-InP cap. A mesa is formed as normal, by selectively etching the p-InP, the Q1.5 (the active layer) and the n-InP layers in turn. The Q1.1 (waveguide) layer is not etched, and this may be expected to have advantages in terms of reliability. The potential disadvantages are the need to grow on a Q1.1 surface, and the limited height available to fit in blocking layers. It is believed that the following advantages more than outweigh these potential disadvantages: the process is simpler than that first described, accurate control of mesa height is possible, the electronic properties of the blocking layer are likely to benefit from reduced hole injection-holes being trapped by the valence band discontinuity in the Q1.1/InP double heterostructure.

A further useful modification to the above described structure is to use a mesa wider than would normally be permitted in a laser oscillator. An increase in width is possible with low-reflectivity, non-resonant devices, such as TWSLA's, because the optical wave makes only one main pass through the device. Typically the optical input to the laser amplifier will be supplied by a single-mode optical fibre. The fundamental mode will be launched by the input fibre and there may not be enough distance to couple much power into the allowed higher order modes of a wider structure. A benefit of using a wider structure is that increased output power may result.

As well as making devices with the waveguide and active layers separated by a 0.2 μm thick spacer layer, other separations have been tried. In FIG. 6 there are shown photoluminescence plots for four device types, each device type having a different waveguide/active region separation. The photoluminescence plots were all produced using devices having active layers with a quaternary composition (GaInAsP) with a wavelength equivalent of 1.3 μm, and waveguide layers with a quaternary composition (GaInAsP) with a wavelength equivalent of 1.1 μm. For the four plots the separation was 0.2 μm, 0.11 μm, 0.04 μm and zero. The photoluminescence plots illustrate that even for a separation of as little as 0.04 μm there is recombination in the waveguiding layer distinct from that in the active layer. As the separation between the active and the waveguiding layers increases, the proportion of recombination which takes place (at least during the photoluminescence measurement) in the waveguide increases at the expense of recombination in the active layer. In all our device configurations the active layer and the waveguide are optically very closely coupled. We believe that it is important, if low polarisation sensitivity is to be achieved, for the waveguide layer and the active layer to act effectively as a single waveguide—that is without any directional coupler characteristic. With only a small spacing, of say 0.2 μm, between the waveguiding and active layers it is possible to feed the optical output from a lensed fibre into the active and waveguiding layers simultaneously. In the bulk of our experiments such an arrangement has been used with good results. We have also, in so far as it has been possible with a lensed fibre end, directed the input optical signal primarily at the active region with overspill onto the waveguiding layer. Such an arrangement has also given low polarisation sensitivity, and it is believed that this approach is preferable where there is a greater separation between the active and waveguiding layers. In order to obtain low polarisation sensitivity we believe that the separation between the active and the waveguiding layers should be considerably less than 1 μm. More preferably we believe that the separation should be not more than 0.7 μm, and yet more preferably should be not more than 0.6 μm. As those skilled in the art will be aware, the precise upper limit in any case will depend upon the refractive indices of the active, waveguiding and separating layers, since these factors all influence the degree of coupling between the active and waveguiding layers.

Although in the above described examples the waveguiding layers have been shown to comprise quaternary material having a wavelength equivalent of 1.1 μm, it is of course possible to use other compositions, provided that they have a wider bandgap than that of the active layer. For example, in devices having active layers with a composition having a wavelength equivalent of 1.5 μm, we have successfully used waveguiding layers having a wavelength equivalent of 1.3 μm.

We claim:

1. A semiconductor laser amplifier which does not include a grating, which amplifier comprises:
   an active layer provided by a first epitaxial layer,
   a substantially flat waveguiding layer separated from the active layer and provided by a second epitaxial layer, and
   an input facet and an output facet,
   wherein said waveguiding layer and said active layer each extend to both said facets and are separated from each other by a distance of less than one micron, the arrangement being such that, in use, an optical wave in the active layer interacts with the waveguiding layer to reduce the polarisation sensitivity of the amplifier.

2. An amplifier as in claim 1, wherein the separation between the active layer and the waveguiding layer is dimensioned to avoid significant interchange of modal power between said layers in use.

3. An amplifier as in claim 1 or 2 wherein said active layer is grown over said waveguiding layer.

4. An amplifier as in claim 1 or 2 wherein said waveguiding layer is grown over said active layer.

5. An amplifier as in claim 1 or 2 wherein the separation of said active layer and said waveguiding layer is 0.6 micron or less.

6. An amplifier as in claim 1 or 2 wherein the active layer comprises a quaternary semiconductor having a band edge equivalent wavelength of between 1.3 and 1.55 microns.

7. An amplifier as in claim 1 or 2 wherein the active layer has a thickness of less than 0.4 μm.

8. An amplifier as in claim 7, wherein the active layer has a thickness of less than 0.15 micron.

9. An amplifier as in claim 1 or 2 wherein the active layer has a width of no more than 2 μm.

10. An amplifier as in claim 1 or 2 wherein the active layer has a length of 250 μm or more.

11. An amplifier as in claim 10 wherein the active layer has a length of more than 300 μm.

12. An amplifier as in claim 10 wherein the active layer has a length of 500 μm or less.

13. An amplifier as in claim 1 or 2 wherein the reflectivities of the end facets of the amplifier are not more than 0.25% at the operating wavelength of the amplifier.

14. An amplifier as in claim 1 or 2 wherein the polarisation sensitivity of the amplifier does not exceed 3 dB over the frequency range 1500 to 1520 nm.

15. An amplifier as in claim 14 wherein the polarisation sensitivity does not exceed 1 dB over the frequency range 1500 to 1520 nm.

16. An amplifier as in claim 1 or 2 wherein the saturated output power is at least 5 dBm.

17. An amplifier as in claim 1 or 2 and having input means arranged, in use, to direct optical input signals having a variable polarisation state onto the input facet of the laser amplifier, the input means, in use, causing the input optical signals to impinge on both said active and waveguiding layers on said input facet.

18. An amplifier as in claim 17 wherein, in use, the input means is arranged so that the input optical signals provide at said input facet greater optical intensity on said active layer than on said waveguiding layer.

19. An amplifier as in claim 17 wherein said input means comprises an optical fibre and lens means.

20. A method of amplifying variable polarisation optical signals, which method comprises:
supplying optical signals to be amplified to a facet of a semiconductor laser amplifier, the laser amplifier comprising an active layer and a separate substantially flat waveguiding layer which each extend as far as said facet and which are separated by not more than 1 μm, and
the input optical signals to be amplified impinging on both the waveguiding layer and the active layer at said facet.

21. A semiconductor laser amplifier having no feedback grating therein and comprising:
an input facet for receiving optical signals to be amplified;
an output facet for providing amplified optical signals therefrom;
an active layer having ends thereof respectively forming parts of said input and output facets of the amplifier; and
an inactive waveguide layer having substantially flat surfaces and having ends thereof also respectively forming parts of said input and output facets of the amplifier;
said active and waveguide layers being separated but closely disposed between their respective ends sufficient to optically interact and reduce polarisation sensitivity of the amplifier less than 2 dB.

* * * * *